US011629409B2

(12) United States Patent
Gautam et al.

(10) Patent No.: US 11,629,409 B2
(45) Date of Patent: Apr. 18, 2023

(54) INLINE MICROWAVE BATCH DEGAS CHAMBER

(71) Applicant: APPLIED MATERIALS, INC., Santa Clara, CA (US)

(72) Inventors: Ribhu Gautam, Singapore (SG); Ananthkrishna Jupudi, Singapore (SG); Tuck Foong Koh, Singapore (SG); Preetham P. Rao, Singapore (SG); Vinodh Ramachandran, Singapore (SG); Yueh Sheng Ow, Singapore (SG); Yuichi Wada, Chiba (JP); Cheng-Hsiung Tsai, Cupertino, CA (US); Kai Liang Liew, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 947 days.

(21) Appl. No.: 16/424,302

(22) Filed: May 28, 2019

(65) Prior Publication Data

US 2020/0378006 A1 Dec. 3, 2020

(51) Int. Cl.
*C23C 16/511* (2006.01)
*B01J 19/12* (2006.01)
(Continued)

(52) U.S. Cl.
CPC .......... *C23C 16/511* (2013.01); *B01J 19/126* (2013.01); *C23C 16/545* (2013.01); *H05B 6/64* (2013.01); *H01J 37/32192* (2013.01)

(58) Field of Classification Search
CPC .......... C23C 16/452; C23C 16/45542; C23C 16/45544; C23C 16/45546; C23C 16/45557; C23C 16/45561; C23C 16/45565; C23C 16/50; C23C 16/505; C23C 16/511; C23C 16/52; C23C 16/545;
(Continued)

(56) References Cited

U.S. PATENT DOCUMENTS

| 5,639,309 | A | 6/1997 | Akimoto |
| 7,204,885 | B2 * | 4/2007 | Derderian ........... C23C 16/4557 118/724 |

(Continued)

FOREIGN PATENT DOCUMENTS

| JP | 2012-094600 A | 5/2012 |
| JP | 2015-0170572 A | 9/2015 |

OTHER PUBLICATIONS

International Search Report and Written Opinion for PCT/US2020/033443 dated Sep. 4, 2020.

*Primary Examiner* — Hung D Nguyen
(74) *Attorney, Agent, or Firm* — Moser Taboada (57) ABSTRACT

Methods and apparatus for a substrate processing chamber are provided herein. In some embodiments, a substrate processing chamber includes a chamber body having sidewalls defining an interior volume having a polygon shape; a selectively sealable elongated opening disposed in an upper portion of the chamber body for transferring one or more substrates into or out of the chamber body; a funnel disposed at a first end of the chamber body, wherein the funnel increases in size along a direction from an outer surface of the chamber body to the interior volume; and a pump port disposed at a second end of the chamber body opposite the funnel.

20 Claims, 5 Drawing Sheets

(51) Int. Cl.
*C23C 16/54* (2006.01)
*H05B 6/64* (2006.01)
*H01J 37/32* (2006.01)

(58) Field of Classification Search
CPC ........ C23C 16/56; H05B 6/64; H05B 6/6402;
H05B 6/6408; H05B 6/6411; H05B
6/6447; H05B 6/645; H05B 6/6491;
H05B 6/70; H05B 6/701; H05B 6/705;
H05B 6/707; H05B 6/708; H05B 6/72;
H05B 6/76; H05B 6/80; H05B 6/806;
B01J 19/126; B01J 19/1887; H01J
37/32165; H01J 37/32192; H01J 37/3244;
H01J 37/32357; H01J 37/32449; H01J
37/32467; H01J 37/32577; H01J
37/32623; H01J 37/32642; H01J
37/32633; H01J 37/32715
USPC ....... 219/678, 679, 680, 685, 686, 690–699,
219/736–743, 756, 762, 763
See application file for complete search history.

(56) References Cited

U.S. PATENT DOCUMENTS

| | | | |
|---|---|---|---|
| 8,866,271 B2 | 10/2014 | Yamamoto et al. | |
| 9,214,369 B2* | 12/2015 | Vopat | H01L 21/67781 |
| 2005/0241767 A1* | 11/2005 | Ferris | H01J 37/32633 |
| | | | 156/345.35 |
| 2010/0184267 A1* | 7/2010 | Kabe | H01L 29/513 |
| | | | 438/771 |
| 2011/0097900 A1 | 4/2011 | Augustino et al. | |
| 2013/0168389 A1* | 7/2013 | Ikeda | H05B 6/806 |
| | | | 219/756 |
| 2014/0068962 A1 | 3/2014 | Mori et al. | |
| 2015/0090708 A1* | 4/2015 | Tanaka | H05B 6/806 |
| | | | 219/753 |
| 2015/0136759 A1 | 5/2015 | Ikeda et al. | |
| 2016/0353522 A1 | 12/2016 | Rathi et al. | |

\* cited by examiner

INLINE MICROWAVE BATCH DEGAS CHAMBER

FIELD

Embodiments of the present disclosure generally relate to substrate processing systems, and more specifically, to degas chambers for use in substrate processing systems.

BACKGROUND

In the processing of semiconductor substrates, substrates are often degassed between processes to remove absorbed gases, moisture, etc. from the substrate prior to, for example, performing deposition or other processes on the substrate. If the absorbed gaseous impurities are not removed prior to subsequent processing, they may undesirably outgas during the process, leading to contamination, quality reduction, or the like. The inventors have observed that typical degassing chambers process a single substrate at a time. Multiple degassing chambers can be provided to increase throughput. However, such a solution is costly and leaves a bulky footprint.

Accordingly, the inventors have provided an improved processing chamber for removing moisture from one or more substrates.

SUMMARY

Methods and apparatus for a substrate processing chamber are provided herein. In some embodiments, a substrate processing chamber includes a chamber body having sidewalls defining an interior volume having a polygon shape; a selectively sealable elongated opening disposed in an upper portion of the chamber body for transferring one or more substrates into or out of the chamber body; a funnel disposed at a first end of the chamber body, wherein the funnel increases in size along a direction from an outer surface of the chamber body to the interior volume; and a pump port disposed at a second end of the chamber body opposite the funnel.

In some embodiments, a degas chamber includes a chamber body including an interior volume having a regular polygon shape, wherein the chamber body includes a selectively sealable elongated opening for transferring one or more substrates into or out of the chamber body; a substrate support disposed in the interior volume and configured to support one or more substrates, wherein the substrate support is movable at least to a raised position aligned with the elongated opening and to a lowered position; a heat source configured to heat the one or more substrates when disposed on the substrate support; a plurality of openings in the chamber body configured to flow gas into the interior volume; and an exhaust port disposed in the chamber body.

In some embodiments, a microwave degas chamber includes a chamber body including an interior volume having a regular polygon shape, wherein the chamber body includes a first selectively sealable elongated opening for transferring one or more substrates into the chamber body and a second selectively sealable elongated opening for transferring the one or more substrates out of the chamber body; a substrate support disposed in the interior volume and configured to support a plurality of substrates; a microwave source coupled to the chamber body at a first end of the chamber body; and a pump coupled to the chamber body at a second end of the chamber body opposite the first end.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a substrate processing chamber are provided herein. The substrate processing chamber may advantageously be placed in line with a multi-chamber processing tool to save physical footprint and increase throughput. For example, the substrate process chamber may advantageously be placed below a load lock chamber of the multi-chamber processing tool so that there is no increase in tool footprint. An example of a multi-chamber processing tool that is suitable for use with the substrate processing chamber of the present disclosure is any of the Applied Charger® line of processing tools, commercially available from Applied Materials, Inc., of Santa Clara, Calif. Other processing chambers from Applied Materials, Inc., or other manufacturers, may also benefit from the inventive apparatus disclosed herein.

In some embodiments, the substrate processing chamber is configured to support one substrate and perform a degas process on the substrate via a resistive heater embedded in a substrate support. In some embodiments, the substrate processing chamber is configured to support one or more substrates to advantageously perform a batch degas process on the one or more substrates via microwave heating. The substrate processing chamber includes a configurable gas flow and pumping arrangement to accommodate degassing of various types of substrates and varied batch sizes. For example, silicon semiconductor substrates, polymer substrates, epoxy substrates, or any other substrates suitable for moisture removal via a microwave energy source. The substrate processing chamber described herein may be used at atmospheric pressure or sub-atmospheric pressure, for example $1\times10^{-7}$ pascal.

Figure 1:
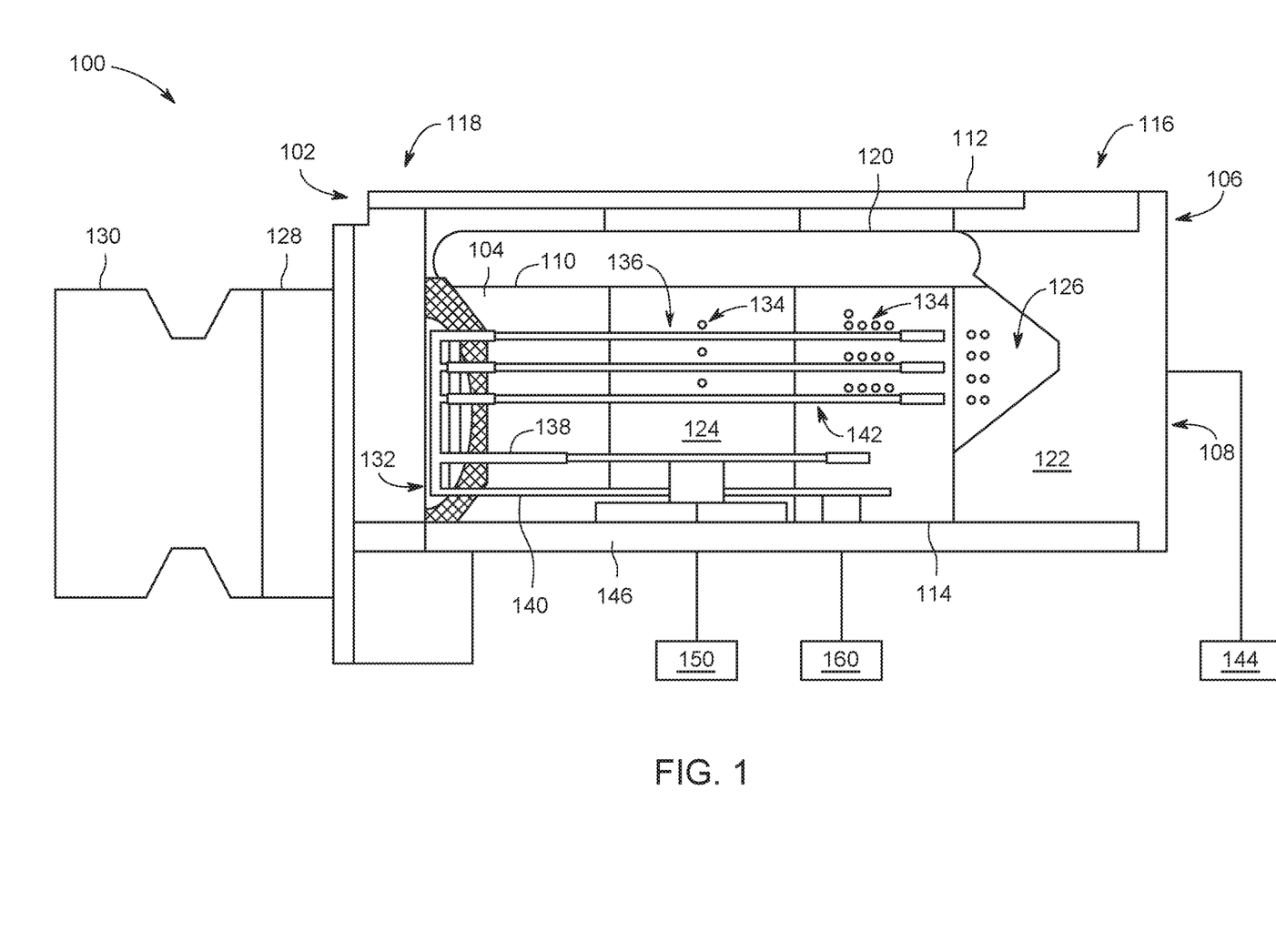
FIG. 1 is a schematic side view of a substrate processing chamber in accordance with at least some embodiments of the present disclosure.

FIG. 1 is a schematic side view of a substrate processing chamber in accordance with at least some embodiments of the present disclosure. The substrate processing chamber 100 includes a chamber body 102 having sidewalls 104, a lid 112, and a chamber floor 114 enclosing an interior volume 124. In some embodiments, the sidewalls 104 define an interior volume having a polygon shape. In some embodiments, the sidewalls 104 define an interior volume having a regular polygon shape. For example, as shown in FIG. 1, the sidewalls 104 form an octagon shape. In some embodiments, the sidewalls 104 define an interior volume 124 that is circular in shape. The sidewalls 104 include a plurality of openings 134 to flow gas into the interior volume 124. In some embodiments, the plurality of openings 134 are symmetrically arranged about the chamber body 102 to advantageously provide more uniform gas flow across the surfaces of the one or more substrates.

The chamber body 102 includes an upper portion 106 and a lower portion 108. The lid 112 is disposed on an upper surface of the upper portion 106. The lower portion 108 includes a base plate 146 having a surface that defines the chamber floor 114.

A first elongated opening 110 that can be selectively sealed (e.g., a slit valve opening) is disposed in the upper portion 106 of the chamber body 102 for transferring one or more substrates into or out of the chamber body 102. For example, the first elongated opening 110 can facilitate the transferring of one or more substrates between the chamber body and a factory interface of a multi-chamber processing tool. In some embodiments, a second elongated opening 120 that can be selectively sealed (e.g., a second slit valve opening) is disposed in the upper portion 106 of the chamber body 102 for transferring one or more substrates into or out of the chamber body 102. For example, the second elongated opening 120 can facilitate the transferring of one or more substrates between the chamber body 102 and a load lock chamber or other chambers of a multi-chamber processing tool. In some embodiments, the first elongated opening 110 is disposed opposite the second elongated opening 120.

The chamber body 102 includes a first end 116 opposite a second end 118. A microwave source 144 is coupled to the chamber body 102 at the first end 116. The microwave source 144 is configured to provide volumetric heating to the interior volume 124 to degas one or more substrates disposed within the interior volume 124. In some embodiments, the microwave source is a variable frequency microwave source with each frequency being active for a brief duration in time. For example, in some embodiments, the brief duration in time is in the order of milliseconds. In some embodiments, the microwave source provides microwave energy to the chamber body 102 at frequencies ranging from about 5.0 to about 7.0 gigahertz. In some embodiments, the microwave source provides microwave energy with microwave frequencies ranging from about 5.85 to about 6.65 gigahertz. In some embodiments, the microwave energy is from a broad C-band source. In some embodiments, a sweep rate is about 0.25 microseconds per frequency across 4096 frequencies in the C-band. The use of variable frequency and a fast sweeping prevents standing wave formation and charge accumulation and the need for rotating thermal load. The use of variable frequency also allows for uniform cross substrate temperature distribution.

In some embodiments, the first end 116 includes a service door 122 that is selectively sealable and removable from the rest of the chamber body 102. The service door 122 is advantageously removable to allow service and installation of components within the interior volume 124 of the chamber body 102. A funnel 126 extends from an outer surface of the chamber body 102 to one of the sidewalls 104 to expose the interior volume 124 to microwave energy provided by the microwave source 144. In some embodiments, the funnel 126 can be in one of the sidewalls 104 defined by the service door 122. In some embodiments, the microwave source 144 provides microwaves having a given wavelength and the funnel 126 is disposed at least two times the given wavelength away from a closest portion of a substrate support 136 disposed in the interior volume 124 to provide more uniform heating to the one or more substrates when disposed on the substrate support 136.

The second end 118 includes a pump port 132, or exhaust port, disposed in the chamber body 102, opposite the funnel 126. The pump port 132 is fluidly coupled to a pump 130. The pump 130 can be any pump suitable for evacuating degassed material from the interior volume 124. In some embodiments, a pump adapter 128 is disposed between the pump port 132 and the pump 130 to facilitate the coupling of various different pumps to the pump port 132.

Figure 5:
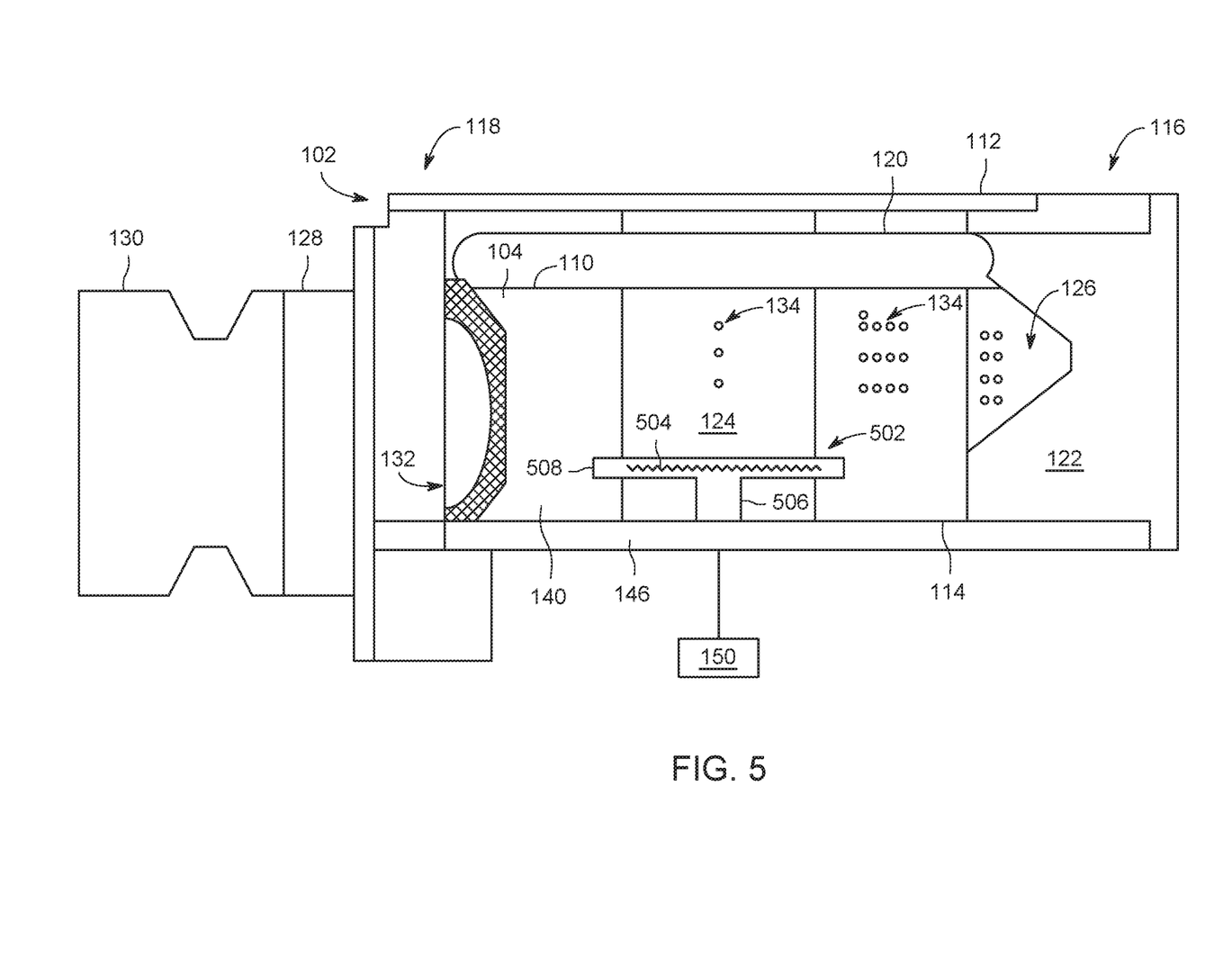
FIG. 5 is a schematic side view of a substrate processing chamber in accordance with at least some embodiments of the present disclosure.

In some embodiments, as shown in FIG. 5, a substrate support 502 is disposed in the interior volume 124 of the chamber body 102 and is configured to support one substrate. The substrate support 502 includes a pedestal 504 coupled to a shaft 506 that extends through an opening (e.g., center opening 306) in the base plate 146. The pedestal 504 includes a resistive heater 504 embedded in the pedestal 504 and coupled to a power source to heat a substrate disposed on the pedestal 504. The substrate support 502 is coupled to a first actuator 150 that controls the position of the pedestal 504 at least between a transfer position and a processing position.

In some embodiments, and as shown in FIG. 1, the substrate support 136 is configured to support a plurality of substrates. For example, in some embodiments, the substrate support 136 includes a plurality of support members 142 disposed in a vertically spaced apart orientation along a common axis of the substrate support (e.g., aligned along a vertical axis). While three support members 142 are shown, the substrate support 136 may include any number of support members 142. In some embodiments, the plurality of support members 142 are coupled to a base ring 138 disposed below the plurality of support members 142. In some embodiments, the substrate support 136 includes a plurality of lift members 220 (discussed below) corresponding to the plurality of support members 142. The plurality of lift members 220 are coupled to a lift ring 140 disposed below the plurality of lift members 220.

In some embodiments, the base ring 138 is coupled to the first actuator 150 that controls the position of the plurality of support members 142 at least between a transfer position and a processing position. In some embodiments, the lift ring 140 is coupled to a second actuator 160 that controls the position of a plurality of lift members 220 independently of the position of the plurality of support members 142. The first actuator 150 and the second actuator 160 can be any suitable linear motion controller, such as a linear drive servo actuator motor, or the like. The first actuator 150 and the second actuator 160 may be disposed outside of the chamber body 102 and pass through an opening in the chamber floor 114 of the chamber body 102 sealed with, for example, a stainless steel bellows, or the like.

Figure 2:
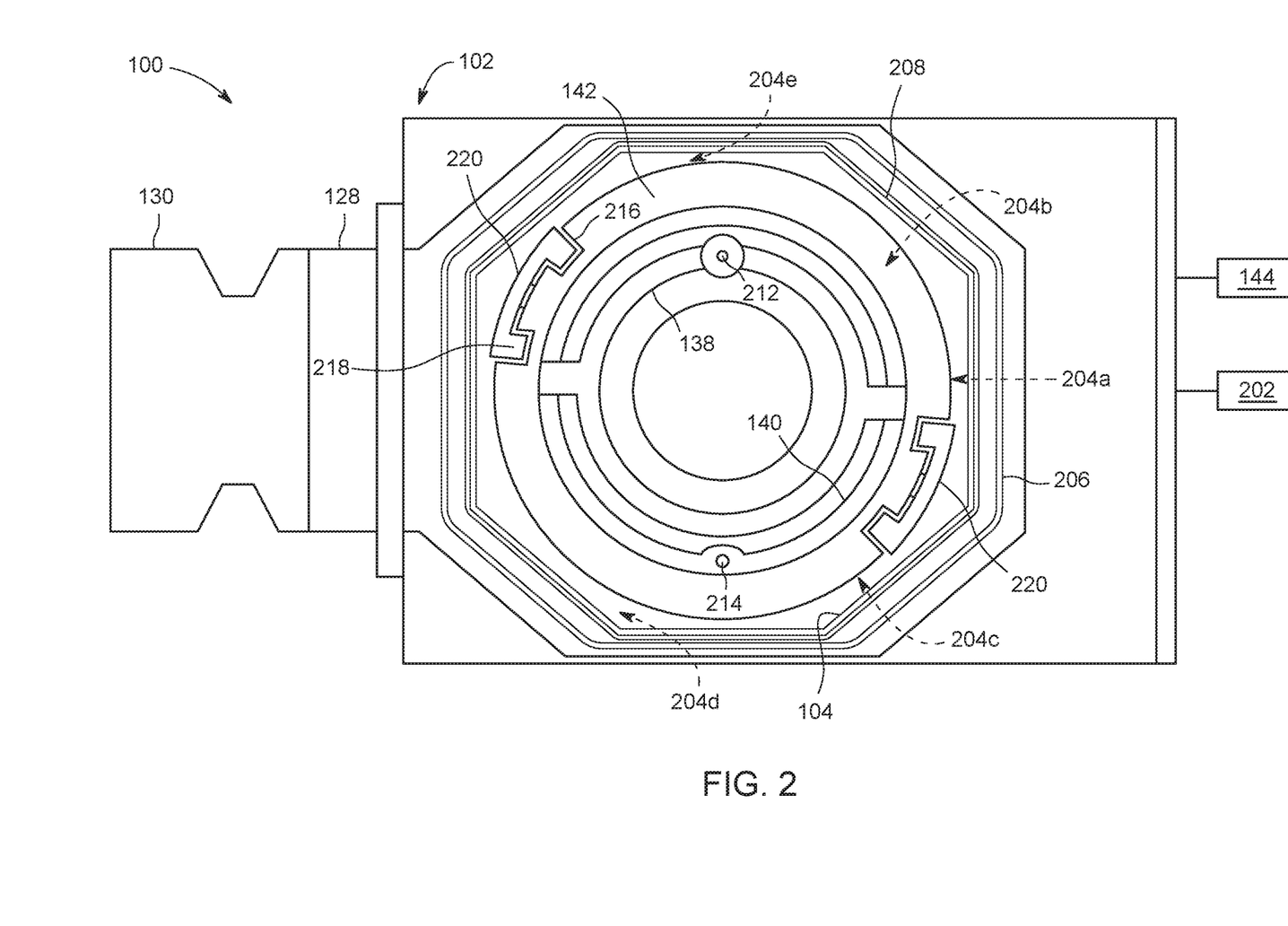
FIG. 2 is a schematic top view of the substrate processing chamber of FIG. 1.

FIG. 2 is a schematic top view of the substrate processing chamber 100. The support members 142 can be configured as a ring having a central opening (as depicted in FIG. 2) or as a plate, or in some other planar geometry. Providing the support member 142 as a ring or as a plate advantageously provides full support of the substrate and can further assist in flattening warped substrates in certain applications, such as when substrates are heated when disposed upon the support members 142.

Each support member 142 includes a support surface that is substantially planar to support a substrate having a given dimension (e.g., a given diameter for round substrates, a given length and width for rectangular substrates, or the like). In some embodiments, one or more support guides may be provided on the support surface to guide a substrate toward a centered position on the support surface.

Each lift member 220 includes one or more lift surfaces 218. In some embodiments, the one or more lift surface 218 are inwardly extending fingers. In some embodiments, each support member 142 includes a plurality of slots 216 along a peripheral edge to accommodate the one or more lift surfaces 218. The lift surfaces 218 are substantially planar surfaces to support a respective substrate and are configured to support a substrate having the given dimension discussed above with respect to the support surface. In some embodiments, a plurality of lift members 220 may be provided for each respective support member 142. For example, as shown in FIG. 2, a pair of lift members 220 are provided for each respective support member 142. In some embodiments, a pair of lift surfaces 218 are provided for each respective lift member 220.

The plurality of lift members 220 (and corresponding lift surfaces 218) are movable with respect to the support members 142 between a processing position, in which the lift surfaces 218 are disposed coplanar with, or below, the support surfaces of the support members 142 and a transfer position, in which the lift surfaces 218 are disposed above the support surfaces.

In some embodiments, one or more openings 212 are provided in the base ring 138 to facilitate coupling the base ring 138 to the first actuator 150. The first actuator 150 may include an actuator shaft that can extend through an opening in the chamber floor 114 and be coupled to the base ring 138. In some embodiments, one or more openings 214 are provided in the lift ring 140 to facilitate coupling the lift ring 140 to the second actuator 160. The second actuator 160 may include an actuator shaft that can extend through an opening through the chamber floor 114 and be coupled to the lift ring 140.

In some embodiments, an upper surface of the chamber body 102 includes an O-ring groove 206 disposed about the sidewalls 104. The O-ring groove 206 is configured to accommodate an O-ring to provide a seal between the lid 112 and the chamber body 102. In some embodiments, the O-ring groove 206 may correspond with a shape of the sidewalls 104. For example, as shown in FIG. 2, the O-ring groove 206 has an octagon shape. In some embodiments, the chamber body 102 includes an RF gasket groove 208 to accommodate a metal RF gasket. The RF gasket groove 208 is disposed between the sidewalls 104 and the O-ring groove 206. The RF gasket groove 208 is configured to receive an RF gasket to advantageously reduce or prevent microwave energy from leaking to and degrading the O-ring disposed in the O-ring groove 206. In some embodiments, the chamber body 102 includes a similar arrangement of an O-ring groove and a RF gasket groove at an interface between the service door 122 and the remaining portion of the chamber body 102.

In some embodiments, a gas source 202 is fluidly coupled to the plurality of openings 134 in the chamber body to provide a gas flow to the interior volume 124 to aid in the removal of undesired materials, such as moisture, from the interior volume 124. In some embodiments, the gas source 202 is configured to provide a gas flow to the interior volume 124 from multiple sidewalls 104. For example, gas flow paths 204a-204c extend from sidewalls 104 adjacent the funnel 126. In some embodiments, gas flow paths 204d-204e extend from sidewalls 104 having the first elongated opening 110 and the second elongated opening 120, respectively.

Figure 3:
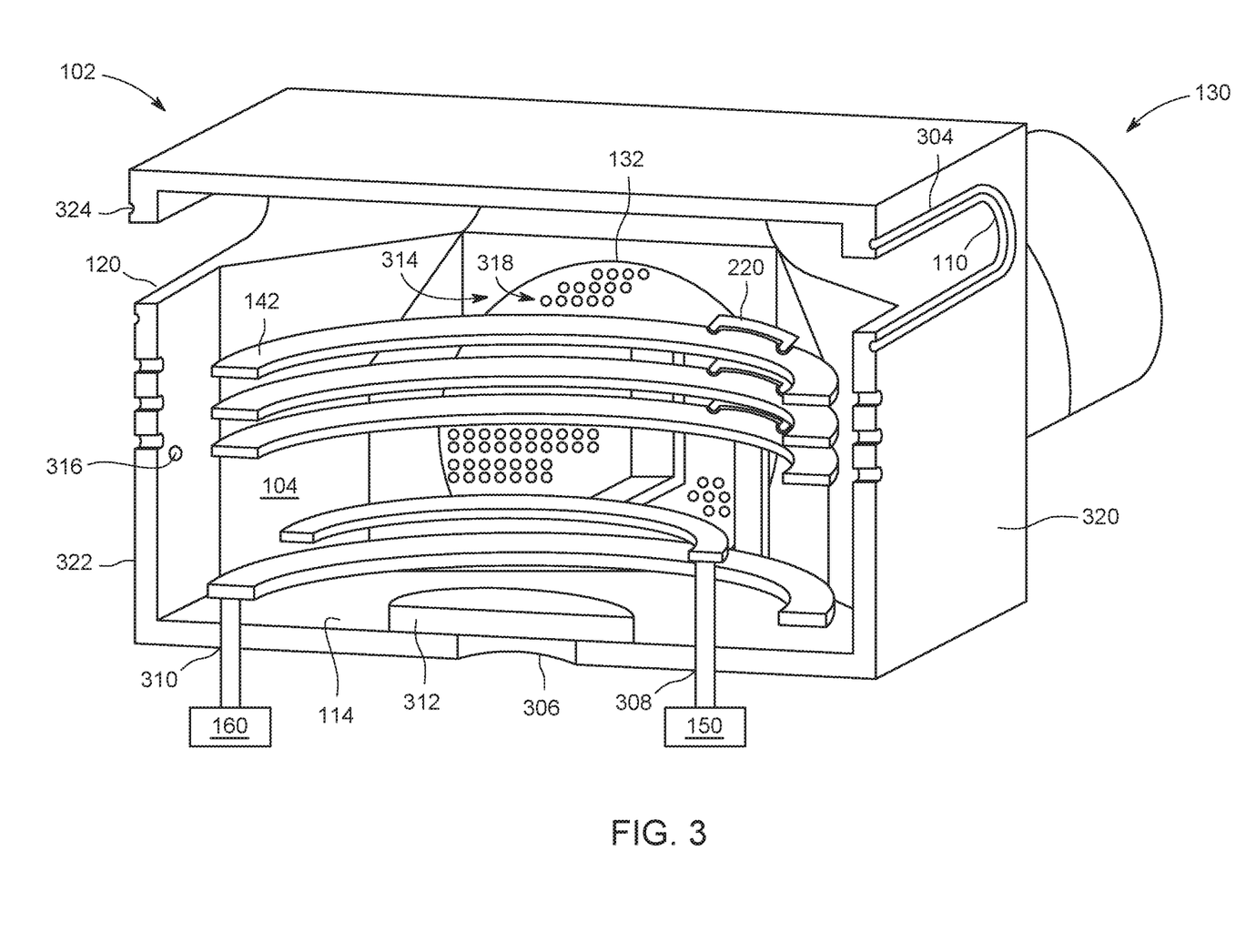
FIG. 3 is a partial isometric view facing a second end of the substrate processing chamber of FIG. 1.

FIG. 3 is a partial isometric view facing the second end 118 of the substrate processing chamber 100. In some embodiments, a mesh screen 314 is disposed between the inner volume of the chamber body 102 and the pump port 132. The mesh screen 314 includes a plurality of openings 318 that overlay the pump port. The plurality of openings 318 are configured to reduce or eliminate microwave leakage through the pump port 132. The plurality of openings 318 may have a circular shape, a regular polygon shape, or any other suitable shape. In some embodiments, the plurality of openings 318 are sized to be less than one fourth of the given wavelength of the microwave source. In some embodiments, the plurality of openings 318 are sized to be about 2.5 mm to about 5.0 mm.

In some embodiments, an RF gasket groove 304 is disposed in an exterior surface 320 of the chamber body 102 and surrounding the first elongated opening 110 to advantageously reduce or prevent microwave leakage. In some embodiments, an RF gasket groove 324 is disposed in an exterior surface 322 of the chamber body 102 and surrounding the second elongated opening 120.

The chamber floor 114 includes one or more openings. In some embodiments, the chamber floor 114 includes a center opening 306 configured to accommodate a substrate support comprising a pedestal and an embedded resistive heater. In some embodiments, a plate 312 is disposed above the center opening 306 and coupled to the chamber floor 114. The plate 312 is configured to cover the center opening 306 when the substrate support 136 comprises the plurality of support members 142, as shown in FIG. 3. The center opening 306 along with the plate 312 allow for the chamber body 102 to be used with a variety of substrate supports, for example, the substrate support 502 shown in FIG. 5. In some embodiments, the chamber floor 114 includes an opening 308 to accommodate the first actuator 150. In some embodiments, the chamber floor 114 includes an opening 310 to accommodate the second actuator 160.

In some embodiments, a temperature sensor 316 is disposed in the sidewall 104 of the chamber body. In some embodiments, the temperature sensor 316 is disposed between the first elongated opening 110 and the chamber floor 114. In some embodiments, the temperature sensor 316 is disposed between the second elongated opening 120 and the chamber floor 114. In some embodiments, the temperature sensor 316 is a non-contact infrared sensor. In some embodiments, the temperature sensor 316 is configured to measure a temperature of a bottommost substrate when disposed on the substrate support 136. In some embodiments, the temperature sensor 316 is coupled to a PID controller to control the microwave energy output to the chamber body 102 to maintain the one or more substrates in a desired temperature range.

Figure 4:
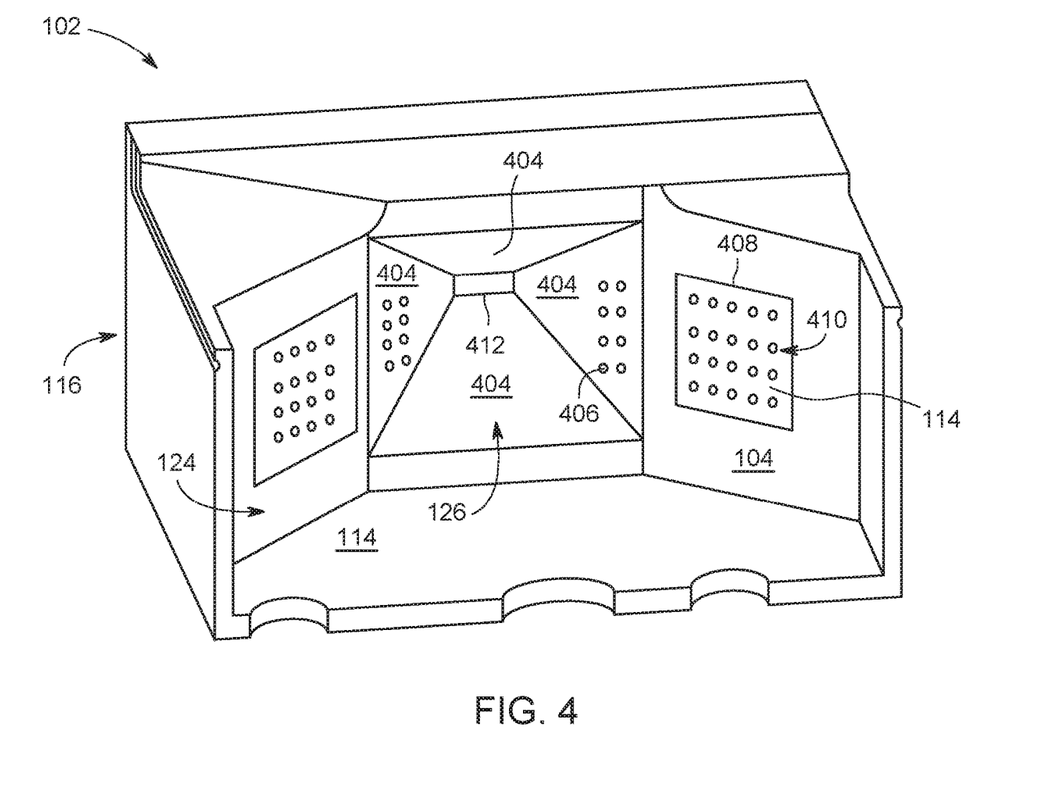
FIG. 4 is a partial isometric view facing a first end of a chamber body of FIG. 1.

FIG. 4 is a partial isometric view facing the first end 116 of the chamber body 102 in accordance with at least some embodiments of the present disclosure. The chamber body 102 includes the funnel 126 to expose the interior volume 124 to microwave energy provided by the microwave source 144. In some embodiments, the funnel 126 increases in size along a direction from the outer surface of the chamber body 102 to the interior volume 124. In some embodiments, the funnel 126 includes interior volume-facing surfaces 404 that are arranged to form a rectangular cross-sectional funnel opening 412. In some embodiments, one or more of the interior volume-facing surfaces 404 include a plurality of openings 406 to flow gas into the interior volume 124. In some embodiments, the plurality of openings 406 are disposed on opposing interior volume-facing surfaces 404. In some embodiments, the plurality of openings 406 are part of the plurality of openings 134 discussed above. For example, the plurality of openings 406 may correspond with gas flow path 204*a*. In some embodiments, the interior volume-facing surfaces 404 are sloped at an angle between about 25 degrees to about 55 degrees relative to a central axis of the funnel.

In some embodiments, sidewalls 104 adjacent the funnel 126 include a plurality of openings 410 arranged in a series of rows and columns or any other suitable pattern to flow gas into the interior volume. In some embodiments, the plurality of openings 410 are part of the plurality of openings 134 discussed above. For example, the plurality of openings 410 may correspond with gas flow path 204*b* and gas flow path 204*c*. In some embodiments, the plurality of openings 410 are disposed in a removable gas plate 414 that is disposed in a gas plate cutout 408 on the sidewalls 104. The removable gas plate 414 advantageously allows for customizable sizing and positioning of the plurality of openings 410 as required for each degassing process.

While the foregoing is directed to embodiments of the present disclosure, other and further embodiments of the disclosure may be devised without departing from the basic scope thereof.

The invention claimed is:

1. A substrate processing chamber, comprising:
a chamber body having sidewalls defining an interior volume having a polygon shape;
a selectively sealable elongated opening disposed in an upper portion of the chamber body for transferring one or more substrates into or out of the chamber body;
a funnel disposed in one of the sidewalls of the chamber body at a first end of the chamber body, wherein an opening of the funnel increases in size along a direction from an outer surface of the chamber body to the interior volume;
a plurality of openings disposed in the sidewalls adjacent to the funnel to flow gas into the interior volume; and
a pump port disposed at a second end of the chamber body and opposite the funnel.

2. The substrate processing chamber of claim 1, wherein interior volume-facing surfaces of the funnel are arranged to form a rectangular cross-sectional funnel opening.

3. The substrate processing chamber of claim 1, wherein the opening of the funnel, on a side facing the interior volume, extends to an adjacent one of the sidewalls of the chamber body.

4. The substrate processing chamber of claim 1, wherein surfaces of the funnel include a plurality of gas openings.

5. The substrate processing chamber of claim 1, further comprising:
an RF gasket groove disposed in an exterior surface of the chamber body and surrounding the selectively sealable elongated opening.

6. The substrate processing chamber of claim 1, further comprising an O-ring groove disposed on a top surface of the chamber body and about the sidewalls and an RF gasket groove disposed between the sidewalls and the O-ring groove.

7. The substrate processing chamber of claim 1, further comprising:
an opening on a chamber floor of the chamber body configured to accommodate a substrate support.

8. The substrate processing chamber of claim 1, further comprising:
a second selectively sealable elongated opening opposite the selectively sealable elongated opening for transferring one or more substrates into or out of the chamber body.

9. A degas chamber, comprising:
a chamber body including an interior volume having a polygon shape, wherein the chamber body includes a selectively sealable elongated opening for transferring one or more substrates into or out of the chamber body;
a substrate support disposed in the interior volume and configured to support one or more substrates, wherein the substrate support is movable at least to a raised position aligned with the elongated opening and to a lowered position;
a heat source configured to heat the one or more substrates when disposed on the substrate support; and
an exhaust port disposed in the chamber body, wherein the chamber body includes a funnel disposed opposite the exhaust port, wherein surfaces of the funnel include a plurality of gas openings.

10. The degas chamber of claim 9, wherein the substrate support is configured to support a plurality of substrates and the heat source is a microwave source.

11. The degas chamber of claim 10, wherein the funnel is coupled to the microwave source, wherein the funnel extends through a sidewall of the chamber body orthogonal to a support surface of the substrate support, and wherein an opening of the funnel increases in size along a direction toward the interior volume.

12. The degas chamber of claim 11, wherein the funnel has a rectangular cross sectional shape.

13. The degas chamber of claim 10, wherein the substrate support comprises a plurality of support members configured to support a plurality of substrates in a vertically spaced apart orientation.

14. The degas chamber of claim 10, further comprising a mesh screen disposed between the chamber body and the exhaust port, wherein the mesh screen includes a plurality of openings configured to reduce or eliminate microwave leakage through the exhaust port.

15. The degas chamber of claim 9, further comprising a temperature sensor disposed in a sidewall of the chamber body between the elongated opening and a chamber floor of the chamber body.

16. The degas chamber of claim 9, wherein the funnel is a sole funnel of the chamber body.

17. The degas chamber of claim 9, wherein the substrate support is configured to support one substrate and the heat source is a resistive heater embedded in the substrate support.

18. A microwave degas chamber, comprising:
a chamber body including an interior volume having sidewalls that define a regular polygon shape, wherein the chamber body includes a first selectively sealable elongated opening for transferring one or more substrates into the chamber body and a second selectively sealable elongated opening for transferring the one or more substrates out of the chamber body;
a substrate support disposed in the interior volume and configured to support a plurality of substrates in a vertically spaced apart orientation, the substrate support comprising a plurality of support members and a plurality of lift members configured to be controlled independently of the plurality of support members to selectively raise or lower the plurality of substrates onto or off of the plurality of support members;

a microwave source coupled to the chamber body at a first end of the chamber body;

a funnel disposed in one of the sidewalls of the chamber body at the first end of the chamber body;

a plurality of openings disposed in the sidewalls of the chamber body adjacent to the funnel to flow gas into the interior volume; and a pump coupled to the chamber body at a second end of the chamber body opposite the first end.

19. The microwave degas chamber of claim 18, wherein the microwave source provides microwaves to the chamber body at a frequency range of about 5.0 to 7.0 gigahertz.

20. The microwave degas chamber of claim 18, wherein the microwave source provides microwaves having a given wavelength, and wherein the chamber body includes a funnel with an opening disposed at least two times the given wavelength away from a closest portion of the substrate support.

\* \* \* \* \*